United States Patent [19]

Herold et al.

[11] Patent Number: 4,953,187

[45] Date of Patent: Aug. 28, 1990

[54] HIGH SPEED PRESCALER

[75] Inventors: Barry W. Herold, Boca Raton; Omid Tahernia, Coconut Creek, both of Fla.

[73] Assignee: Motorola, Inc., Schaumburg, Ill.

[21] Appl. No.: 300,449

[22] Filed: Jan. 23, 1989

[51] Int. Cl.⁵ ............................................. H03K 23/48
[52] U.S. Cl. ...................................... 377/48; 377/108; 377/117; 377/121; 377/122
[58] Field of Search .................. 377/47, 48, 108, 121, 377/122, 117

[56] References Cited

U.S. PATENT DOCUMENTS

| | | | |
|---|---|---|---|
| 4,193,037 | 3/1980 | Kyu | 377/117 |
| 4,389,728 | 6/1983 | Tsuzuki | 377/121 |
| 4,390,960 | 6/1983 | Yamashita et al. | 377/48 |
| 4,394,769 | 7/1983 | Lull | 377/122 |
| 4,606,059 | 8/1986 | Uida | 377/108 |
| 4,696,020 | 9/1987 | Carlach | 377/117 |

Primary Examiner—John S. Heyman
Attorney, Agent, or Firm—Vincent B. Ingrassia; Anthony J. Sarli, Jr.

[57] ABSTRACT

A high speed CMOS divide by 4/5 prescaler circuit comprises first, second, third, fourth, and fifth inverter stages. When a modulas control signal is low, the prescaler operates as five clocked inverters in series having an output which is fed back to the input of the initial stage. That is, the circuit operates as a five stage clocked ring oscillator wherein only one output changes on each clock edge. When a modulas control signal is high indicating that a divide by four is desired, the counter operates as a five stage ring oscillator for seven clock edges. On the eighth edge, feed forward circuitry forces the last three stages to change states simultaneously.

12 Claims, 2 Drawing Sheets

| CLK | STAGE OUTPUTS | | | | | | | | | |
|---|---|---|---|---|---|---|---|---|---|---|
| | 4 MODULAS | | | | | 5 MODULAS | | | | |
| | 10 | 12 | 14 | 16 | 18 | 10 | 12 | 14 | 16 | 18 |
| 0 | 1 | 1 | 0 | 1 | 0 | 1 | 1 | 0 | 1 | 0 |
| 1 | 1 | 0 | 0 | 1 | 0 | 1 | 0 | 0 | 1 | 0 |
| 0 | 1 | 0 | 1 | 1 | 0 | 1 | 0 | 1 | 1 | 0 |
| 1 | 1 | 0 | 1 | 0 | 0 | 1 | 0 | 1 | 0 | 0 |
| 0 | 1 | 0 | 1 | 0 | 1 | 1 | 0 | 1 | 0 | 1 |
| 1 | 0 | 0 | 1 | 0 | 1 | 0 | 0 | 1 | 0 | 1 |
| 0 | 0 | 1 | 1 | 0 | 1 | 0 | 1 | 1 | 0 | 1 |
| 1 | 0 | 1 | 0 | 1 | 0 | 0 | 1 | 0 | 0 | 1 |
| 0 | | | | | | 0 | 1 | 0 | 1 | 1 |
| 1 | | | | | | 0 | 1 | 0 | 1 | 0 |

*FIG.2*

HIGH SPEED PRESCALER

BACKGROUND OF THE INVENTION

This invention relates generally to divider circuits and more particularly to an ultra high speed CMOS divide by 4/5 prescaler circuit. Prescaler circuits for use in high speed dividers, frequency synthesizers, and the like, are well known in the art. A dual-modulas prescaler is a counter whose division ratio can be switched from one value to another by an external control signal. That is, a prescaler can divide by a first factor when an applied control signal is high, or by a second factor when the applied control signal is low. An indepth discussion of prescalers can be found in "Phase-Locked Loops" by Dr. Ronald E. Best, copyright 1984, McGraw-Hill Inc.

In an article entitled "A 250 MHz Dynamic CMOS Dual Modulas ($\div 8/9$) Prescaler" by Chris Groves et al. and beginning on page 110 of the minutes of the 1984 Conference on Advance Research in VLSI, MIT, there is described a dual modulas ($\div 8/9$) prescaler for use in a digital 250 MHz CMOS programmable divider circuit. This prescaler comprises three cascaded standard CMOS inverters, one NOR gate, and three functionally distinct inverter circuits. Unfortunately, the circuit operates in a primarily sequential manner thus limiting its speed. Furthermore, the use of a significant number of components further restricts speed and increases the circuits power consumption.

SUMMARY OF THE INVENTION

It is an object of the present invention to provide an improved prescaler circuit.

It is a further object of the present invention to provide an improved high-speed CMOS prescaler circuit.

It is a still further object of the present invention to provide a high-speed CMOS divide by 4/5 prescaler circuit.

Yet another object of the present invention is to provide a high-speed CMOS divide by 4/5 circuit which utilizes fewer components.

It is a still further object of the present invention to provide an improved prescaler circuit which employs feed forward to increase speed.

According to broad aspect of the invention, there is provided a high-speed prescaler circuit which comprises a plurality of cascaded inverter circuits, each having first and second inputs and an output, the first input of each for receiving an input signal such as a clock signal. An intermediate inverter circuit has a first input for receiving the clock signal and a second input coupled to the output of the last one of the cascaded inverter circuits. An output inverter circuit includes first, second and third inputs. The first input of the output inverter circuit receives a clock signal, and the second input is coupled to the output of the intermediate inverter circuit. The output of the output inverter circuit is coupled back to the second input of the first one of the plurality of cascaded inverter circuits. A feed forward circuit which is coupled to the output of at least a selected one of the plurality of cascaded inverter circuits and to a source of a modulas control signal has an output coupled to the third input of the output inverter circuit for forcing the output of the output inverter circuit to a predetermined state. In this manner, the modulas of the signal appearing at the output of the output inverter circuit may be varied between first and second values, depending upon whether a modulas control signal is in a first or second state. The use of fewer components and the incorporation of the feed forward circuit enhances the speed at which the inventive prescaler circuit can function.

The above and other objects, features, and advantages of the present invention will be more clearly understood from the following detailed description taken in conjunction with the accompanying drawings, in which:

BRIEF DESCRIPTION OF THE DRAWINGS

FIG. 2 is a truth table illustrating both the modulas 4 and modulas 5 outputs of each of the inverter stages in the circuit of FIG. 1.

DESCRIPTION OF THE PREFERRED EMBODIMENT

Figure 1:
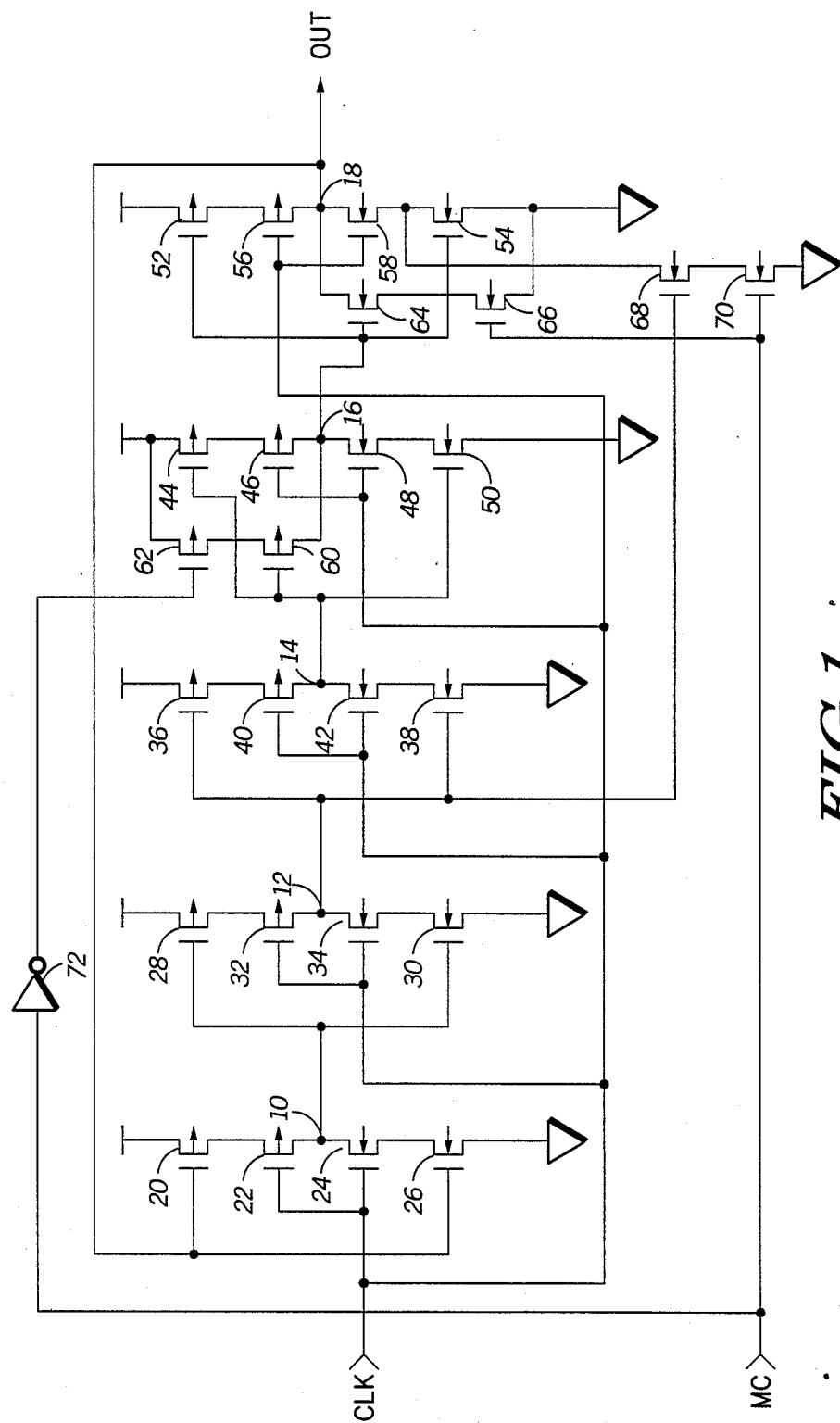
FIG. 1 is a schematic diagram of the inventive prescaler circuit.

The inventive prescaler circuit shown in FIG. 1 comprises first, second, third, fourth and fifth CMOS inverter circuits having outputs 10, 12, 14, 16, and 18 respectively. The first inverter circuit includes P-channel field-effect-transistors 20 and 22 and N-channel field-effect-transistors 24 and 26. The output 10 of the first inverter circuit is coupled to the gate electrodes of P-channel field-effect-transistor 28 and N-channel field-effect-transistor 30 in the second converter circuit. The remainder of the second inverter circuit comprises P-channel field-effect-transistor 32 and N-channel field-effect-transistor 34.

The output 12 of the second inverter circuit is applied to the gate of P-channel field-effect-transistor 36 and to the gate of N-channel field-effect-transistor 38 in the third inverter circuit. P-channel field-effect-transistor 40 and N-channel field-effect-transistor 42 make up the remainder of the third inverter circuit. The fourth inverter circuit is comprised of P-channel field-effect-transistors 44 and 46 and N-channel field-effect-transistors 48 and 50. As can be seen, the output 14 of the third inverter circuit is applied to the gate electrodes of transistors 44 and 50.

Finally, the output 16 of the fourth inverter circuit is applied to the gate electrodes of P-channel field-effect-transistor 52 and N-channel field-effect-transistor 54. The remainder of the fifth inverter circuit comprises P-channel field-effect-transistor 56 and N-channel field-effect-transistor 58. As can be seen, output 18 of the prescaler circuit is fed back to the gate electrodes of P-channel field-effect transistor 20 and N-channel field-effect-transistor 26.

Output 14 of the third inverter circuit is also coupled to the gate electrode of a P-channel field-effect-transistor 60 which has a drain coupled to output 16 and a source coupled to the drain of P-channel field-effect-transistor 62 which in turn has a source coupled to the source of transistor 44. Output 16 is also coupled to the gate electrode of N-channel field-effect-transistor 64 which has a drain coupled to output 18 and a source coupled to the drain of N-channel field-effect-transistor 66 which in turn has a source coupled to the source of transistor 54. Finally, N-channel field effect-transistor 68 has a drain coupled to the source of transistor 58, a gate coupled to the output 12 of the second inverter circuit, and a source coupled to the drain of N-channel field-effect-transistor 70.

A bistable clock signal (CLK) is supplied to the gate electrodes of transistors 22, 24, 32, 34, 40, 42, 46, 48, 56, and 58. A modulas control signal (MC) capable of assuming first and second stable states is applied to the gate electrodes of transistors 66 and 70 and, after inversion by inverter 72, to the gate electrode of transistor 62.

Since each of the inverter circuits operate identically, the operation of only one will be discussed. Referring to the second inverter circuit comprised of transistors 28, 30, 32, and 34, it can be seen that the source of P-channel field-effect-transistor 28 is coupled to a first source of supply voltage and its drain is coupled to the source of P-channel field-effect-transistor 32. The drain of both transistors 32 and 34 are coupled to output 12. The source of transistor 34 is coupled to the drain of transistor 30 which in turn has a source coupled to a second source of supply voltage (e.g., ground).

Assume for the time being that output 10 is high (i.e. logical 1). Transistor 28 is off and transistor 30 is on. Thus, when the clock signal goes high, transistor 34 will turn on causing output 12 to go low. Assume next that output 10 is a low (i.e. a logical 0). Transistor 28 is on and transistor 30 is off. When the clock signal goes low, transistor 32 will turn on causing output 12 to go high.

Realizing that each of the five inverter stages operates in the same manner, the operation of the entire prescaler circuit may be addressed. When the modulas control signal (MC) is low, transistors 62, 66, and 70 are off. Therefore, transistors 62, 66, and 70 and transistors 60, 64, and 68 are effectively removed from the circuit. This being the case, the circuit operates as five clocked inverters in series with output 18 fed back to the input. That is, it operates as a five-stage clocked ring oscillator wherein only one output changes on each clock edge thus producing a modulas five output at output 18. The sequence of outputs 10, 12, 14, 16, and 18 is shown in the right hand portion of the FIG. 2 truth table.

To convert the circuit to a modulas four prescaler, modulas control signal MC is caused to go high. Now transistors 66 and 70 are turned on as is transistor 62. Thus, output 16 will be forced to a high state whenever transistor 60 turns on (i.e. whenever output 14 is low). Similarly, output 18 will be forced low whenever transistor 64 turns on (i.e. whenever output 16 is high). Finally, if MC is high, transistor 68 will turn on as soon as output 12 in the second inverter stage goes high. Thus, a low voltage will be applied to the source of transistor 58 in the fifth inverter circuit. Under this set of conditions, transistor 58 will turn on whenever the clock signal goes high causing a low to appear at output 18.

Thus, the circuitry represented by transistors 60, 62, 64, 66, 68, and 70 function to force outputs 16 and 18 to predetermined states when MC is high and the proper output conditions exist at 10 and 12. That is, referring again to FIG. 2, when MC is high, the circuit again operates as a five stage ring counter for seven clock edges. On the eighth edge, (01101), the additional feedforward or look-ahead circuitry forces the third, fourth and fifth inverter circuits (outputs 14, 16, and 18) to change states simultaneously thus causing counts 01001 and 01011 to be skipped.

This may also be illustrated as follows: Assume that outputs 10, 12, 14, 16 and 18 are 01101 respectively and that the clock CLK is zero. This corresponds to the seventh state of the modulas four truth table shown in FIG. 2. In this case, transistor 20 is off causing output 10 to remain at zero, and since both transistors 30 and 34 are off, output 12 is maintained at a high level. In the third inverter stage, transistor 42 is off due to the low clock signal permitting output 14 to be maintained high. Because output 14 is high, transistor 60 will remain off, and the high output at 14 will cause transistor 44 to remain off thus maintaining a low output at 16. The low output at 16 will cause transistor 64 to remain off, and the low clock signal will cause transistor 58 to remain off thus maintaining a high output at 18.

When the clock signal next rises, transistor 22 is turned off maintaining the low output at 10. As a result, transistor 30 in the second inverter circuit remains off thus maintaining output 12 high. Next, however, it can be seen that transistor 42 turns on as a result of the high clock signal. Since transistor 38 is on due to the high output at 12, output 14 will fall to a low value. With output 14 low, transistor 50 turns off, and since the clock signal is high, transistor 46 will likewise turn off. A low at output 14 and at the output of inverter 72 will cause both transistors 60 and 62 to turn on thus causing output 16 to rise. Finally, with output 12 high and the modulas control signal (MC) high, both transistors 68 and 70 turn on causing a low voltage to appear at the source of transistor 58. Thus, when the clock signal goes high, turning transistor 58 on output 18 will fall to zero. Furthermore, with MC high and output 16 high, both transistors 64 and 66 will turn on, thus enhancing the pull-down of output 18. Thus, the five inverter stages now have outputs corresponding to the eighth step in the modulas four truth table shown in FIG. 2.

Thus, there has been described a modulas 4/5 prescaler circuit which incorporates standard CMOS devices in a unique and novel arrangement so as to provide high speed of operation. It should be noted that the above description is given by way of example only, and changes in form and details may be made by one skilled in the art without departing from the scope of the invention. For example, while the inventive circuit shown in FIG. 1 comprises five inverter stages, a prescaler circuit utilizing the heart of the invention could be made using a different number of inverter stages. Therefore, the circuit shown in FIG. 1 may be considered as comprising a first plurality of cascaded inverter stages (in this case, the first three inverter stages), at least one intermediate stage (in this case, the fourth inverted stage), and an output inverter stage.

What is claimed is:
1. A high-speed prescaler circuit, comprising;
an odd plurality of cascaded inverter circuits each having first and second inputs and an output, said first input of each said plurality for receiving an input signal;
an intermediate inverter circuit having a first input for receiving said input signal, a second input coupled to the output of a last one of said plurality of cascaded inverter circuits, and having an output;
an output inverter circuit having first, second, and third inputs and an output, said first input of said output inverter circuit for receiving said input signal and said second input of said output inverter circuit coupled to the output of said intermediate inverter circuit, the output of said output inverter circuit coupled to said second input of a first one of said plurality of cascaded inverter circuits, the output of said output inverter circuit forming an output of said prescaler circuit;

feed forward circuit means having at least a first input coupled to the output of at least a first preselected one of said plurality of cascaded inverter circuits, having an output coupled to the third input of said output inverter circuit for forcing the output of said output inverter circuit to a predetermined state, and at least a second input coupled to receive a control signal, said control said capable of assuming first and second states, the output of said output inverter circuit being forced to said predetermined state once a control signal is in said first state; and first circuit means having a first input coupled to said control signal, a second input coupled to the output of a last one of said plurality of cascaded inverter circuits, and an output coupled to said intermediate inverter circuit for forcing the output of said intermediate inverter circuit to a predetermined state when said control signal is in said first state and the output of a last one of said plurality of cascaded inverter circuits is in a predetermined state.

2. A prescaler according to claim 1 wherein said input signal is a clock signal having a frequency f and wherein the output of said output inverter circuit is a modulas X output when said control signals in said first state and in modulas Y output when said control signal is in said second state, where X and Y are integers.

3. A prescaler circuit according to claim 2 wherein said plurality of cascaded inverter circuits comprises three cascaded inverter circuits and wherein X is 4 and Y is 5.

4. A high-speed divide by 4/5 prescaler circuit, comprising:

first, second, third, fourth, and fifth inverter circuits each having a first input coupled to receive a clock signal and each having an output, said second, third, fourth, and fifth inverted circuit each having a second input coupled to the output of the immediately preceding inverter circuit, said first inverter circuit having a second input coupled to the output of said fifth inverter circuit;

means for receiving a modulas control signal capable of assuming first and second states; and feed forward circuit means coupled to said fifth inverter circuit and responsive to said modulas control signal for altering the modulas of an output signal appearing at the output of said fifth inverter circuit.

5. A prescaler circuit according to claim 4 wherein said feed forward circuit means has as an input the output of said second inverter circuit.

6. A prescaler circuit according to claim 5 wherein each of said first, second, third, fourth, and fifth inverter circuits comprise:

a first P-channel field-effect-transistor having a source coupled to receive a first supply voltage, a gate coupled to receive an input signal, and a drain;

a second P-channel field-effect-transistor having a source coupled to the drain of said first P-channel field-effect-transistor, a gate for receiving a clock signal, and having a drain forming the output of the inverter circuit;

a first N-channel field-effect-transistor having a drain coupled the drain of said second P-channel field-effect-transistor, a gate coupled to receive said clock signal, and a source; and a second N-channel field-effect-transistor having a drain coupled to the source of said first N-channel field-effect transistor, a gate coupled to receive said input signal, and a source coupled to receive a second source of supply voltage.

7. A prescaler circuit according to claim 6 wherein the output of said fifth inverter circuit is a modulas four output when said modulas control signal is in said first state.

8. A prescaler circuit according to claim 6 wherein the output of said fifth inverter circuit is a modulas five output when said modulas control signal is in said second state.

9. A prescaler circuit according to claim 6 wherein said feed forward circuit means includes:

a third N-channel field-effect-transistor having a drain coupled to the source of the first N-channel field-effect-transistor in said fifth inverter circuit, a gate coupled to the output of said second inverter circuit, and having a source; and a fourth N-channel field-effect-transistor having a drain coupled to the source of said third N-channel field-effect-transistor, a gate coupled to receive said control signal, and a source coupled to receive said second source of supply voltage.

10. A prescaler circuit according to claim 9 wherein said feed forward circuit means further comprises:

a third P-channel field-effect-transistor having a source coupled to the source of the first P-channel field-effect-transistor in said fourth inverter circuit, a gate coupled to receive said control signal and having a drain;

a fourth P-channel field-effect-transistor having a source coupled to the drain of said third P-channel field-effect-transistor, a gate coupled to the output of said third inverter circuit, and a drain coupled to the output of said fourth inverter circuit;

a fifth N-channel field-effect-transistor having a drain coupled to the output of said fifth inverter circuit, a gate coupled to the output of said fourth inverter circuit, and having a source; and a sixth N-channel field-effect-transistor having a drain coupled to the source of said fifth N channel field effect transistor, a gate coupled to receive said control signal, and a source coupled to receive said second source of supply voltage.

11. A high-speed prescaler circuit, comprising:

an odd plurality of cascaded inverter circuits each having first and second inputs and an output, said first input of each said plurality for receiving an input signal;

an intermediate inverter circuit having a first input for receiving said input signal, a second input coupled to the output of a last one of said plurality of cascaded inverter circuits, and having an output;

an output inverter circuit having first, second, and third inputs and an output, said first input of said output inverter circuit for receiving said input signal and said second input of said output inverter circuit coupled to the output of said intermediate inverter circuit, the output of said output inverter circuit coupled to said second input of a first one of said plurality of cascaded inverter circuits and forming an output of said prescaler circuit; and feed forward circuit means having a first input coupled to receive a modulas control signal and a second input coupled to the output of a second one of said plurality of cascaded inverter circuits, and having an output coupled to said output inverter circuit for altering the modulas of an output signal appearing at the output of said output inverter circuit in response to the state of said modulas control signal.

12. A prescaler circuit according to claim 11 when said plurality of cascaded inverter circuits is comprises of three cascaded inverter circuits and wherein the output appearing at the output of said output inverter circuit is a modulas four output when said control signal is in a first state and a modulas five output when said control signal is in a second state.

* * * * *